(12) United States Patent
Zinger et al.

(10) Patent No.: US 6,357,984 B1
(45) Date of Patent: Mar. 19, 2002

(54) STORAGE ASSEMBLY FOR WAFERS

(75) Inventors: Jan Zinger, Dwingeloo; Gert-Jan Snijders, Amersfoort; Cornelis Marinus Kooijman, Nieuwegein, all of (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/446,876

(22) PCT Filed: Jul. 3, 1998

(86) PCT No.: PCT/NL98/00383

§ 371 Date: Dec. 23, 1999

§ 102(e) Date: Dec. 23, 1999

(87) PCT Pub. No.: WO99/01894

PCT Pub. Date: Jan. 14, 1999

(30) Foreign Application Priority Data

Jul. 3, 1997 (NL) .......................................... 10064461

(51) Int. Cl.⁷ ............................. B65G 1/12; H01L 21/00
(52) U.S. Cl. .................................. 414/331.05; 414/940
(58) Field of Search ....................... 414/331.01, 331.02, 414/331.03, 331.05, 800, 808, 940

(56) References Cited

U.S. PATENT DOCUMENTS

| | | | | |
|---|---|---|---|---|
| 3,780,852 A | * | 12/1973 | Weiss et al. | 414/331.03 X |
| 3,809,263 A | * | 5/1974 | Dodd et al. | 414/331.03 |
| 4,561,820 A | * | 12/1985 | Matheny et al. | 414/331.03 |
| 4,844,679 A | * | 7/1989 | Teranishi | 414/331.05 |
| 4,867,629 A | * | 9/1989 | Iwasawa et al. | 414/331.05 |
| 4,981,409 A | * | 1/1991 | Hirose et al. | 414/331.01 X |
| 4,986,715 A | * | 1/1991 | Asakawa | 414/331.05 |
| 5,062,763 A | * | 11/1991 | Maier | 414/331.05 X |
| 5,222,285 A | * | 6/1993 | Horikawa | 414/331.01 X |
| 5,226,713 A | * | 7/1993 | Matsumura | 312/305 |
| 5,233,844 A | * | 8/1993 | Knippscheer et al. | 414/331.05 X |
| 5,285,333 A | * | 2/1994 | Barr et al. | 414/331.01 X |
| 5,340,261 A | * | 8/1994 | Oosawa et al. | 414/217 |
| 5,498,116 A | * | 3/1996 | Woodruff et al. | 414/331.05 |
| 5,537,311 A | * | 7/1996 | Stevens | 700/57 |
| 5,549,473 A | * | 8/1996 | Valentian | 414/331.05 X |
| 5,595,263 A | * | 1/1997 | Pignataro | 414/331.05 X |
| 5,607,275 A | * | 3/1997 | Woodruff et al. | 414/331.05 |
| 5,967,730 A | * | 10/1999 | Peroni | 414/331.05 |

FOREIGN PATENT DOCUMENTS

| | | |
|---|---|---|
| EP | 0 435 338 | 7/1991 |
| EP | 0 506 045 | 9/1992 |
| GB | 2 199 022 | 6/1988 |

OTHER PUBLICATIONS

International Search Report dated Oct. 9, 1998.

* cited by examiner

*Primary Examiner*—Robert P. Olszewski
*Assistant Examiner*—Gerald J. O'Connor
(74) *Attorney, Agent, or Firm*—Knobbe, Martens, Olson & Bear, LLP

(57) ABSTRACT

A storage assembly has a magazine which is provided with compartments arranged at different heights for receiving cassettes. Each compartment has a base plate provided with means for establishing a predetermined position of the cassettes. A device for placing cassettes in the compartments is height adjustable, positionable in a horizontal plane and provided with a head for gripping the cassettes. The head of the device includes sensor means for determining a vertical position with respect to the magazine as well as a horizontal position thereof. Reference means interact with the sensor means for determining the horizontal position and are arranged in each of the compartments of the magazine.

9 Claims, 2 Drawing Sheets

STORAGE ASSEMBLY FOR WAFERS

FIELD OF THE INVENTION

The present invention relates to a storage assembly for wafers.

A storage assembly of this kind is generally known in the prior art. Due to the continually increasing miniaturization and the increasing number of magazines, in practice it is unrealistic to have such magazines filled by an operator. Moreover, the associated costs are too high. For this reason, it is proposed in the prior art to move such cassettes with the aid of a robot. These cassettes may optionally be filled with wafers which are subjected to some form of treatment. In some devices, a robot of this kind is situated in a chamber which is filled with a particular gas, so that there is no longer any possibility of positioning them manually.

BACKGROUND OF THE INVENTION

Hitherto, automatic positioning has been carried out by manually instructing the movement of the robot and storing the associated position data, i.e. the position of the robot with respect to the magazine, which is designed as a carousel. In this case, it was necessary to repeat this process after any possible disruption to the mutual position of robot and magazine, i.e. to reinput the relative positions. The position-determining means in the magazine did at least allow the cassettes to be arranged at an accurately defined position in the magazine. This is important for further processing and for allowing the wafers to be removed from the magazine accurately. Such disruption to the mutual position of the magazine and the robot takes place at any rate during initial assembly. For if a storage assembly of this kind is set with respect to one another during production, after trial runs the structure will be dismantled and reassembled at the ultimate place of use. If displacements occur in drive motors and the like during operation, it will be necessary to partially dismantle the device, with the result that the mutual position is likewise altered and resetting is required. A change in height can occur as a result of the base plate becoming warped, play which occurs during use and bending under the weight of the cassette in question, if the said cassette is full.

In particular if the number of magazines is relatively great, a setting operation of this kind is time-consuming, while in many cases the operator cannot easily gain access to the various stations, owing to lack of space. Moreover, a particularly accurate control system is required and it is necessary for the various components of the robot and also the rotating part of the carousel to be designed with particularly low tolerance. This is because after setting errors can no longer be corrected.

SUMMARY OF THE INVENTION

The object of the present invention is to avoid the disadvantages described above and to provide a storage assembly in which it is no longer necessary to carry out the complicated instruction of the robot with regard to positioning the cassettes accurately and in which it is not necessary to reinput the data manually after a disruption to the mutual positions of the various components, and in which, moreover, slight tolerances between the various moving parts are acceptable.

This object is achieved with a storage assembly having a magazine which is provided with compartments arranged at different heights for receiving cassettes. Each compartment has a base plate provided with means for establishing a predetermined position of the cassettes. A device for placing cassettes in the compartments is height adjustable, positionable in a horizontal plane and provided with a head for gripping the cassettes. The head of the device includes sensor means for determining a vertical position with respect to the magazine as well as a horizontal position thereof. Reference means interact with the sensor means for determining the horizontal position and are arranged in each of the compartments of the magazine. As a result of using sensor means and interacting reference means, each time a cassette is put in position the robot rechecks the extent to which the position of robot and magazine with respect to one another is correct. Then, any required correction is carried out. This takes place completely automatically. As a result, slight tolerances which occur during operation will have no effect on the operation, since the storage assembly according to the invention is self-teaching. Moreover, the stop position of the carousel is no longer critical and deviations are corrected automatically.

Sensor means may be present for determining the vertical position. These may be simple scanning sensors. The associated control system may, for example, be designed in such a way that after the initial contact between the relevant sensor means for determining the height and, for example, the base plate of the relevant compartment of the magazine, the device still moves a fixed distance downwards, in order to reach the correct position involved.

To determine the position in the horizontal direction, it is possible to use simple contact means or contactless means which determine the edge of the carousel. However, these do not allow an xy-position to be determined. Consequently it is necessary to know the position of a fixed point on the base plate. It is thus possible to arrange an opening or some other reference means in the base plate at a fixed position with respect to the position-determining projections for the cassette. If the sensor means on the head of the robot detect these reference means and direct themselves towards them, the correct position for putting down or picking up the cassette will then be reached automatically by moving a fixed distance.

This detectability of the reference means can be increased by providing auxiliary reference means. These cover a larger area, and as soon as the sensor means of the head are situated within this field, they can search for a fixed position with respect to the auxiliary reference means and, starting from this position, can find the main reference means described above. On this basis, the position for picking up or putting down the cassette in question can again be found.

According to a preferred embodiment, the above-described reference means for determining the horizontal position comprise an opening, while the sensor means comprise light-sensitive means. Light-sensitive means of this kind can determine whether or not light is incident through an opening of this kind without further contact being required. This light may comprise any light which is known in the prior art. It may be generated using conventional optical means, but it is also possible to use a laser beam.

If main and auxiliary reference means are used, in the case in which these means are designed as openings, the opening of the auxiliary reference means will be considerably larger than that of the main reference means. One example of such a diameter is 5 and 2 mm, respectively. The accuracy of the head with respect to the carousel must in all cases be + or −2.5 mm. On this assumption, the light beam emanating from the sensor means strikes a boundary edge of the auxiliary reference means. By then carrying out a return movement, or some other movement, another edge of the opening of the auxiliary reference means is struck. By carrying out these reciprocating movements a number of times, it is possible to find the centre of the relevant opening of the auxiliary reference means in question. Then, the movement can be continued until the main reference means, i.e. the opening with the smaller diameter, is found, and then the position with respect to the cassette to be removed or the position-determining projections for positioning the cassette is established.

The above-described robot may comprise any structure which is known in the prior art. However, it preferably comprises a swivelling arm structure with the head arranged at one end and with the other end being height adjustable.

BRIEF DESCRIPTION OF THE DRAWINGS

The invention will be explained in more detail below with reference to an exemplary embodiment depicted in the drawing, in which.

DETAIL DESCRIPTION OF THE INVENTION

Figure 1:
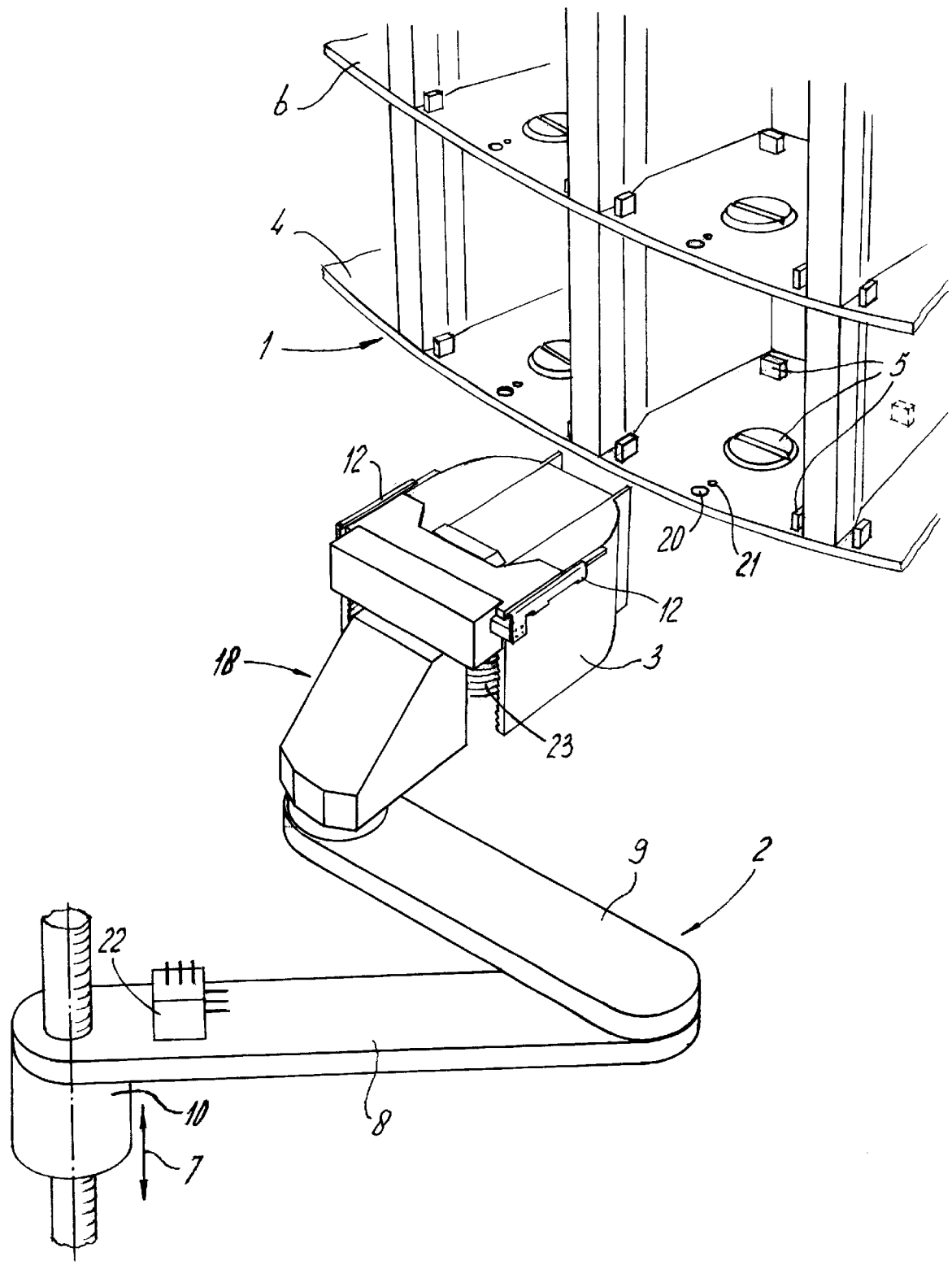
FIG. 1 shows a diagrammatic, perspective view of the storage assembly according to the invention.

In FIG. 1, 1 denotes a magazine. In this case, it comprises a carousel which delimits a number of compartments. Each of the compartments has a base plate 4 or 6, on which cassettes 3 are placed. The correct position of the cassettes is ensured by means of the position-determining projections 5 on the base plate. These projections are dimensioned in such a way that an H-shaped projection on the underside of the cassette is accurately positioned, as is customary with structures of this nature.

Figure 2:
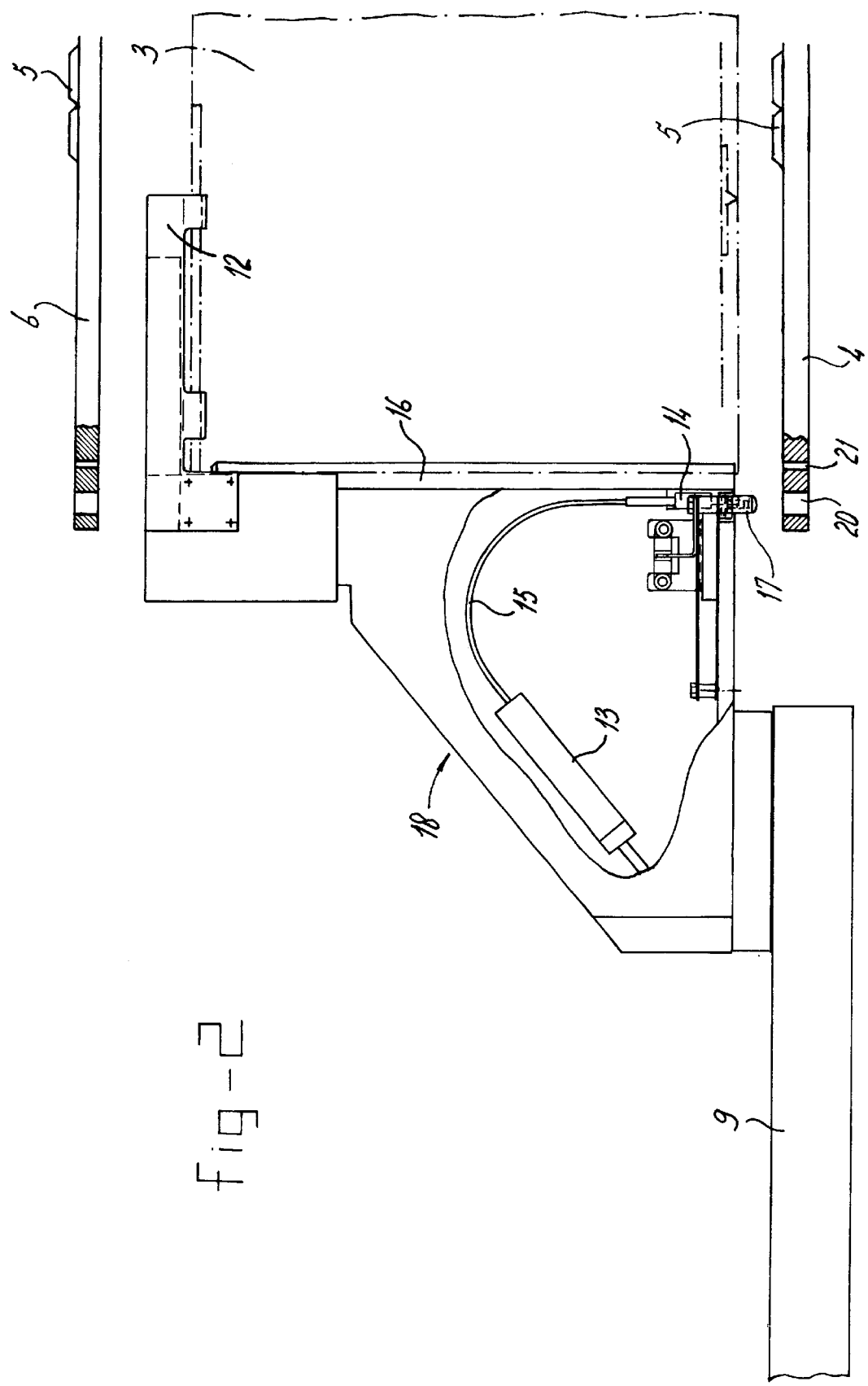
FIG. 2 shows a more detailed side view of the robot according to the invention.

The robot according to the invention is denoted by 2. This robot comprises two arms 8, 9, which are arranged pivotably with respect to one another and on which a plate 10 is arranged at one end, which plate, in addition to the rotating movement, can also execute an upwards/downwards movement in the direction of arrow 7. Moreover, arm 9 is provided with a base plate, to which head 18 is attached. A robot of this kind is generally known in the prior art, and details of the control unit and means which enable the various arms to move with respect to one another will not be described here. A clamping mechanism, comprising clamping bars 12, is arranged on the head in order to be able to grip the cassette. After having been gripped in this way, the cassette can be moved. In a manner which is not shown in more detail, the cassettes may be filled with wafers 23. As can be seen from FIG. 2, head 18 is provided with a spring-loaded height switch 17 and light-sensitive sensor means 13–15 which lie next to it (in the horizontal direction). These sensor means comprise a light source 13, in which another sensor is integrated. 15 denotes a fibre-optic component and 14 denotes a lens. With a device of this kind, it is possible to detect whether or not a light beam emanating from lens 14 is reflected.

16 denotes two rods which are used, if necessary, to push wafers further into the cassette when head 18 moves towards the cassette.

A control unit is diagrammatically depicted at 22. The signals emanating from the sensor means 13–15 and 17 are fed to the control unit. The control unit is also fed with signals relating to the position of the head 18 with respect to component 10 as well as the height of component 10 with respect to a reference plane. On the basis of these signals, the movement of the head 18 is controlled in a manner which is not illustrated in more detail.

Both base plate 4 and base plate 6 are provided in each compartment with a main opening 21 of relatively small diameter (for example 2 mm) and an auxiliary opening 20 of relatively large diameter (for example 5 mm). These openings are always situated at an accurately determined, fixed position with respect to the position-determining projections 5.

The device described above operates as follows.

If head 18 provided with a cassette possibly from another magazine or arranged in some other way between clamping bars 12, which cassette is to be placed in a compartment of the carousel 1, the first part of the movement of head 18 with respect to the compartment in question will be carried out on the basis of a basic routine stored in control unit 22, which if appropriate is assisted manually. This results in a first, very approximate movement of the head with respect to the compartment. This movement is such that the cassette which is later to be put in position is never moved too far, too high or too low into the compartment, which could result in possible damage or undesirable contact.

After it has reached the first, approximate position, head 18, together with the arms 8 and 9, is moved downwards until switch 17 reaches either base plate 6 or base plate 4. As a result, component 17 moves upwards and, in a manner which is not shown in more detail, interrupts a light beam, with the result that a signal is transmitted. When the first signal is received, it is known where head 18 is situated vertically with respect to the compartment in question, and then a fixed upwards travel of, for example, 15 mm is covered. It is then necessary to establish the horizontal position of head 18, in order to enable accurate positioning of the relevant cassette 3, which is not present during calibration, in the position-determining projections 5. For this purpose, in the first instance use is made of the auxiliary opening 20.

Since the accuracy of the head during assembly/dismantling or other irregularities will never deviate by more than approximately 2.5 mm, the auxiliary opening 20 is designed with a diameter of 5 mm. During the sensing movement of head 18, the light beam emanating from sensor 13–15 will detect the circumferential edge of opening 20 at a predetermined moment. Then, the head carries out an approximating movement, i.e. moves in various perpendicular directions in order to determine the centre of opening 20. After this position has been determined, head 18 can move onwards and meets the smaller opening 21 (diameter approximately 2 mm). It is possible that the approximating movement as at opening 20 is realised to determine the centre of opening 21. Then, the position of the head with respect to the compartment in question is established and subsequently, when the head has been loaded with a cassette, the cassette can be positioned accurately. In this case, the position is always checked on the basis of the opening of small diameter, i.e. opening 21. The size of this opening may be less than 2 mm, for example 0.5 mm.

In addition to the sensors described above, it is possible for sensors to be arranged in the clamping mechanism for the cassette. These sensors are activated when the cassette has been gripped in its entirety by the clamping bars 12. If any irregularity occurs, picking up or putting down a cassette will be interrupted and an alarm signal will be given.

The positions registered by the head, and in particular by the sensors arranged therein, are stored in the memory. This means that comparatively slow, albeit automated, searching for the correct position of the cassette with respect to the relevant magazine will take place only in the event of disruption to the various components with respect to one another. Then, such an operation will be carried out considerably more quickly.

Although the invention has been described above with reference to a preferred embodiment, it will be understood that numerous variants may be applied without departing from the scope of the present application. Such variants will be obvious to the person skilled in the art on reading the description and lie within the scope of the claims. For example it is possible to arrange the sensor means in any other suitable position such as the top of head 18. The magazine will be provided with cooperating means on a corresponding location.

What is claimed is:

1. A storage assembly comprising a magazine which is provided with compartments arranged at different heights for receiving cassettes, each compartment comprising a base plate provided with means for establishing a predetermined position of the cassettes, and a device for placing cassettes in said compartments, said device being height adjustable and positionable in a horizontal plane and being provided with a head for gripping said cassettes, wherein the head of said device is provided with sensor means for determining a vertical position with respect to the magazine as well as a horizontal position thereof, reference means, which interact with the sensor means for the purpose of determining the horizontal position, being arranged in each of said compartments of the magazine.

2. The storage assembly according to claim 1, wherein said reference means for determining the horizontal position comprise reference means which are arranged at a fixed, uniform distance with respect to the position-establishing means on the base plate.

3. The storage assembly according to claim 2, wherein said reference means for determining the horizontal position comprise openings in the base plate, said openings having a diameter of less than 2 mm.

4. The storage assembly according to claim 1, wherein said reference means for determining the horizontal position comprise auxiliary reference means and main reference means, which are arranged at a fixed distance with respect to one another, a field of the auxiliary reference means which can be detected by the sensor means corresponding to a maximum expected deviation between head and magazine.

5. The storage assembly according to claim 4, wherein said auxiliary reference means comprise an opening in the base plate, said opening having a diameter of less than 7 mm.

6. The storage assembly according to claim 1, wherein said sensor means comprise light-sensitive sensor means.

7. The storage assembly according to claim 1, further comprising a control unit for regulating a movement of said head to which a signal emanating from the sensor means is fed.

8. The storage assembly according to claim 7, wherein said reference means for determining the horizontal position comprise auxiliary reference means and main reference means, which are arranged at a fixed distance with respect to one another, a field of the auxiliary reference means which can be detected by the sensor means corresponding to a maximum expected deviation between head and magazine, and wherein said control unit is designed to process the signal received from the sensor means after meeting the auxiliary reference means in such a manner that the head including the sensor means is moved to a desired position with respect to the main reference means.

9. The storage assembly according to claim 1, wherein the device comprises a swiveling pivot-arm structure which is provided at a free end with said head.

\* \* \* \* \*